United States Patent [19]
Back et al.

[11] Patent Number: 6,002,426
[45] Date of Patent: Dec. 14, 1999

[54] INVERTED ALIGNMENT STATION AND METHOD FOR CALIBRATING NEEDLES OF PROBE CARD FOR PROBE TESTING OF INTEGRATED CIRCUITS

[75] Inventors: Gerald W. Back; Joseph A. Mirowski, both of Tempe, Ariz.

[73] Assignee: Cerprobe Corporation, Gilbert, Ariz.

[21] Appl. No.: 08/887,073

[22] Filed: Jul. 2, 1997

[51] Int. Cl.[6] .................................................. H04N 17/00
[52] U.S. Cl. ............................... 348/87; 348/94; 348/95; 348/126; 348/190; 382/144; 382/151; 324/758
[58] Field of Search ........................... 348/79–80, 86–87, 348/92, 94–95, 125–126, 129, 190; 382/141, 144–145, 147, 151; 356/237; 364/552; 324/754–758; 250/491.1; H04N 17/00

[56] References Cited

U.S. PATENT DOCUMENTS

| | | | |
|---|---|---|---|
| H1463 | 7/1995 | Ota | 250/491.1 |
| 4,794,648 | 12/1988 | Ayata et al. | 382/151 |
| 5,317,141 | 5/1994 | Thomas | 250/491.1 |
| 5,394,100 | 2/1995 | Bohler et al. | 324/758 |
| 5,422,579 | 6/1995 | Yamaguchi | 324/758 |
| 5,508,527 | 4/1996 | Kuroda et al. | 250/491.1 |
| 5,530,374 | 6/1996 | Yamaguchi | 324/758 |
| 5,657,075 | 8/1997 | Roessner | 348/126 |
| 5,657,394 | 8/1997 | Schwartz etal. | 382/151 |
| 5,831,443 | 11/1998 | Quarre et al. | 324/758 |
| 5,881,165 | 3/1999 | Tanaka | 382/151 |

*Primary Examiner*—Vu Le
*Attorney, Agent, or Firm*—Cahill, Sutton & Thomas P.L.C.

[57] ABSTRACT

A probe needle alignment device supports a probe card assembly with probe needles extending upward. A microscope includes a first eyepiece aligned with the probe needles in its field of view. A first video camera is positioned in optical alignment with the first eyepiece to view probe needles through the first eyepiece. An overdriver includes a transparent planar plate movably disposed between the microscope and the probe needles to displace contact tips of the probe needles through an overdrive distance. A mask plate has a plurality of spots located at positions corresponding precisely to positions of contact pads of an integrated circuit to be probe tested. A second video camera includes the spots within its field of view. Video signals produced by the first and second video cameras are combined to simultaneously represent images of the probe needles and the spots on the probe plate are converted to video images and overlapping images of the probe needles and the spots are simultaneously displayed in a virtual reality headset to aid in alignment of contact tips of probe needles with corresponding spots of the mask plate.

19 Claims, 7 Drawing Sheets

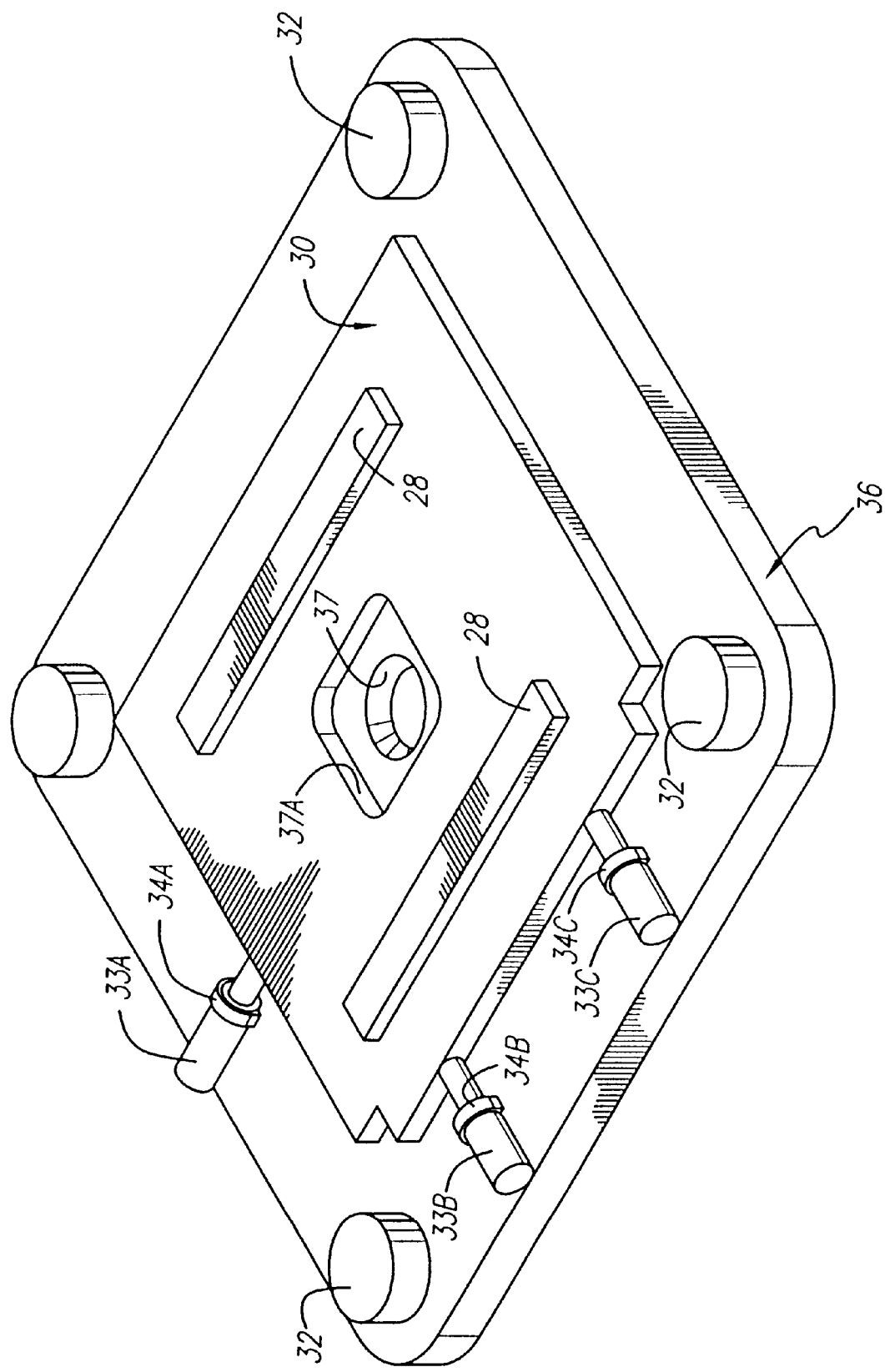

INVERTED ALIGNMENT STATION AND METHOD FOR CALIBRATING NEEDLES OF PROBE CARD FOR PROBE TESTING OF INTEGRATED CIRCUITS

BACKGROUND OF THE INVENTION

The invention relates to an improved method and apparatus for calibrating probe cards to ensure that appropriate overdriven probe needles are in proper alignment with bonding pads of an integrated circuit chip to be "probe tested", and more particularly to an inverted alignment station for performing such calibrating.

In the integrated circuit manufacturing industry each semiconductor wafer may include hundreds of integrated circuit die (i.e., chips), and it is necessary to "probe test" each die before the wafer is cut into the individual integrated circuit die which then are packaged. Such testing often requires most bonding pads to have electrical contact to a tester. To accomplish the probe testing, it is conventional to provide "probe cards" that support a plurality of probe needles, the tips of which must provide electrical contact with corresponding bonding pads of the die under test (DUT). The shank of a probe needle is typically 5 to 10 mils in diameter, and the wafer to be probed is supported on a wafer chuck. Typically, the probe needles are inclined relative to the bonding pads. After alignment of the probe needles with the corresponding bonding pads of the integrated circuit die has been accomplished, the wafer chuck is raised through an approximately 3 mil "over-travel distance" past the point at which the probe tips first contact the pads so that the typically inclined probe needles slide or "scrub" on the aluminum bonding pads of the die to allow good mechanical and electrical contact thereto.

In the course of manufacturing the probe cards, it is necessary to align the probe needles to a "mask" having imprinted thereon "dots" or "targets", the locations of which correspond precisely to the locations of the bonding pads on the die to be probed. As mentioned above, the probe needles are "overdriven" approximately 3 mils during probe testing of an integrated circuit die, so it is necessary to provide the same 3 mils of "overdrive" during "probe needle alignment" with the dots on the mask. Probe needle alignment usually has been performed on a device called an "alignment station". The above mentioned "mask" is located therein with the dots facing upward on a vertically moveable chuck. The probe card to be aligned is mounted securely in the alignment station, with the probe needles pointing downward and as closely aligned as possible with the corresponding dots on the mask. Skilled operators then manipulate suitable tweezers to adjust the probe needles. To accomplish this task, the operator views the needles through a microscope. When the chuck is raised to provide the 3 mil overdrive, the operator identifies needles which need to be bent slightly to be properly aligned with their corresponding dots on the mask. The mask then is lowered so it no longer contacts the needles. The operator then manipulates the tweezers to bend the misaligned needle(s), again raises the chuck to the overdriven position, and re-observes the alignment of the adjusted needles with its corresponding pad on the mask. This procedure is repeated until all needles are properly aligned with the corresponding dots on the mask in the overdriven position. At that point the probe card is ready for use in testing a wafer.

However, the above technique does not allow adequate access to probe needles for the high density, complex probe cards which are needed to test multi-DUT arrays or some of the more complex integrated circuits now being manufactured. Furthermore, the task of aligning probe needles is very taxing to the operators, because of the great precision required in manipulating the tweezers while simultaneously straining to view the needles and tweezers through the microscope. For multi-layer probe needle assemblies, the operator needs to move the upper probe needles out of the way in order to gain access to allow alignment of the lower probe needles. This is very taxing upon the abilities of an operator.

It would be highly desirable to provide an improved probe needle alignment device and system which allows better access for tools such as tweezers to align probe needles with corresponding dots on a mask, allows more accurate alignment of probe needles prior to use, and which also avoids the operator fatigue usually associated with probe needle alignment procedures.

SUMMARY OF THE INVENTION

Accordingly, it is an object of the invention to provide an improved probe needle alignment apparatus and method which provides much better access to probe needles than is the case for the prior art alignment stations.

It is another object of the invention to provide a probe needle alignment system and method which is far less fatiguing to operators than the closest prior art.

It is another object of the invention to provide a probe needle alignment system and method which results in improved, more precise and planar positioning of probe needle tips.

It is another object of the invention to provide an improved probe needle alignment system and method which provides more convenient, effective access by an operator to align probe needles of multi-DUT and/or multi-layer probe cards.

It is another object of the invention to provide a probe needle alignment system and method which avoids the need to overdrive probe needle tips against a mask during the alignment process.

It is another object of the invention to provide an improved probe needle alignment system and method which avoids the need to overdrive probe needle tips during alignment with a plate that is substantially larger than a single integrated circuit DUT to be tested.

It is another object of the invention to provide an improved probe needle alignment system and method which allows much better access by an operator to probe needles during a probe needle alignment operation.

It is another object of the invention to provide an improved multi-layer and/or multi-DUT probe alignment system and method which avoids the need to push aside upper probe needles in order to access and align lower probe needles.

Briefly described, and in accordance with one embodiment thereof, the invention provides an apparatus for aligning probe needles of an integrated circuit wafer testing device including a probe card assembly a plurality of probe needles, a first support device supporting the probe card assembly with the probe needles extending upward from a first surface thereof, a microscope disposed above the probe card assembly and including a first eyepiece generally aligned with some of the probe needles in its field of view, a first video camera positioned in optical alignment with the first eyepiece to view probe needles through the first eyepiece, an overdriver including a transparent planar plate movably disposed between the microscope and the probe needles and operative to displace contact tips of at least some of the probe needles through an overdrive distance, a second support device supporting a mask plate below the probe card assembly, the mask plate having thereon a plurality of spots located at positions corresponding precisely to positions of contact pads of an integrated circuit to be probe tested, a second video camera disposed below the mask plate and in optical alignment with the first video camera, the second video camera including at least some of the spots within its field of view, circuitry combining video signals produced by the first and second video cameras to simultaneously represent images of the probe needles and the spots on the probe plate, and a display simultaneously displaying overlapping images of the probe needles and the spots to aid in alignment of contact tips of probe needles with corresponding spots of the mask plate.

BRIEF DESCRIPTION OF THE DRAWINGS

FIG. 3A is a partial perspective bottom view of the probe card stage portion of the system shown in FIG. 3.

DETAILED DESCRIPTION OF THE PREFERRED EMBODIMENTS

Figure 1:
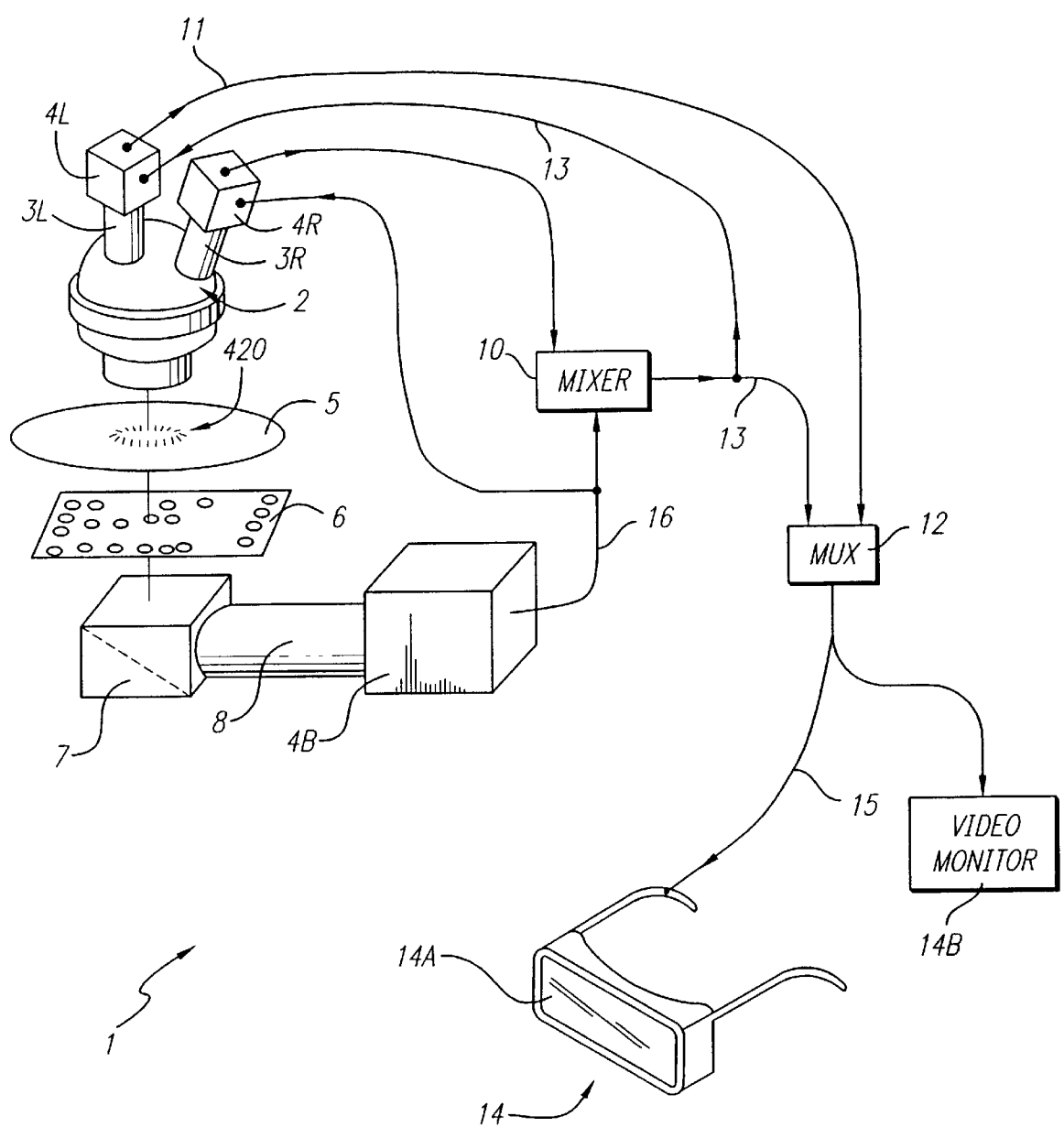
FIG. 1 is a partial perspective diagram illustrating the basic inverted alignment station of the present invention.

Referring now to the drawings, and particularly to FIG. 1, inverted alignment station 1 includes a stereo microscope 2, which can be a model Z7100, available from MEIJI Corporation of Japan. Stereo microscope 2 is located directly above and aligned with probe needles 420 of a probe card assembly 5. Probe card assembly 5 is located above a planar glass mask having "dots" imprinted on its lower surface which correspond precisely to the locations of bonding pads or contact pads of an integrated circuit die to be probe tested using probe card assembly 5 after it has been aligned in accordance with the present invention and then installed on a suitable wafer testing machine.

Stereo microscope 2 includes a right eyepiece 3R and a left eyepiece 3L. The optical axis of right eyepiece 3R is perpendicular to the plane of probe card assembly 5 and mask 6. The optical axis of right eyepiece 3L is inclined by about 7 degrees relative to the optical axis of right eyepiece 3R. A right eye video camera 4R is attached to and optically aligned with right eyepiece 3R. A left eye video camera 4L is attached to and optically aligned with left eyepiece 3L. Video cameras 4R and 4L each can be a model MN401X, commercially available from Elmo Company, LTD of Japan.

Right eye video camera 4R is coupled by a video cable 9 through a mixer 10 and a multiplexer 12 to a "virtual reality" head mounted display (HMD) device 14, which can be a model VIRTUAL i-glasses VTV P/N 9000-D1002-00, commercially available from Virtual I.O., Inc. of Seattle, Wash. Virtual reality headset 14 has a clear front panel 14A, which allows that the user can look through it and clearly see what is in front of him/her, and also has an internal screen display of the video information transmitted to it from video cameras 4R, 4L and a mask camera 4B, located directly below mask 6.

Mask camera 4B is coupled by zoom/focus optics unit 8 to a right angle mirror assembly 7 so that its optical axis is perpendicular to the plane of mask 6 (after being "folded" 90 degrees by mirror 7). Mask camera 4B can be a model XC-73, commercially available from Sony Corporation of Japan. Zoom/focus optics unit 8 can be a model ZOOM6000II, commercially available from Navitar Inc. of Rochester, N.Y. The non-inverting right angle cube 29 is commercially available from Bender Associates, Inc. of Tempe, Ariz.

The output signal from the mask camera 4B is coupled by video cable to an input of a mixer 10 and to a video synchronization input of the right eye video camera 4R. The output of the right eye video camera 4R is coupled by video cable to a second input of mixer 10. The mixed video output is coupled by video cable to both an input of a multiplexer 12 and a video synchronization input of the left eye video camera 4L. The output of left eye video camera 4L is coupled by video cable to the other input of multiplexer 12, which produces the frame sequential multiplexed video signal on cable 15, which then is applied to the video input of the stereo head mounted display 14.

In accordance with the present invention, the operator can wear virtual reality headset 14, have clear vision of the view in front of clear panel 14A (FIG. 1), have a three-dimensional stereo view of probe needles 420, and simultaneously view the dots of the mask with which the needle tips are to be aligned. Therefore, the operator can observe manipulation of misaligned probe needles to bring them into alignment with corresponding dots 18 of mask 6, with a view of such corresponding dots superimposed on the three-dimensional view of the probe needles. The operator can select appropriate magnification to enable him/her to accomplish the needed alignment. The overdriven configuration of the probe needles during the alignment procedure is accomplished by means of the overdrive assembly 47 subsequently described.

Figure 2:
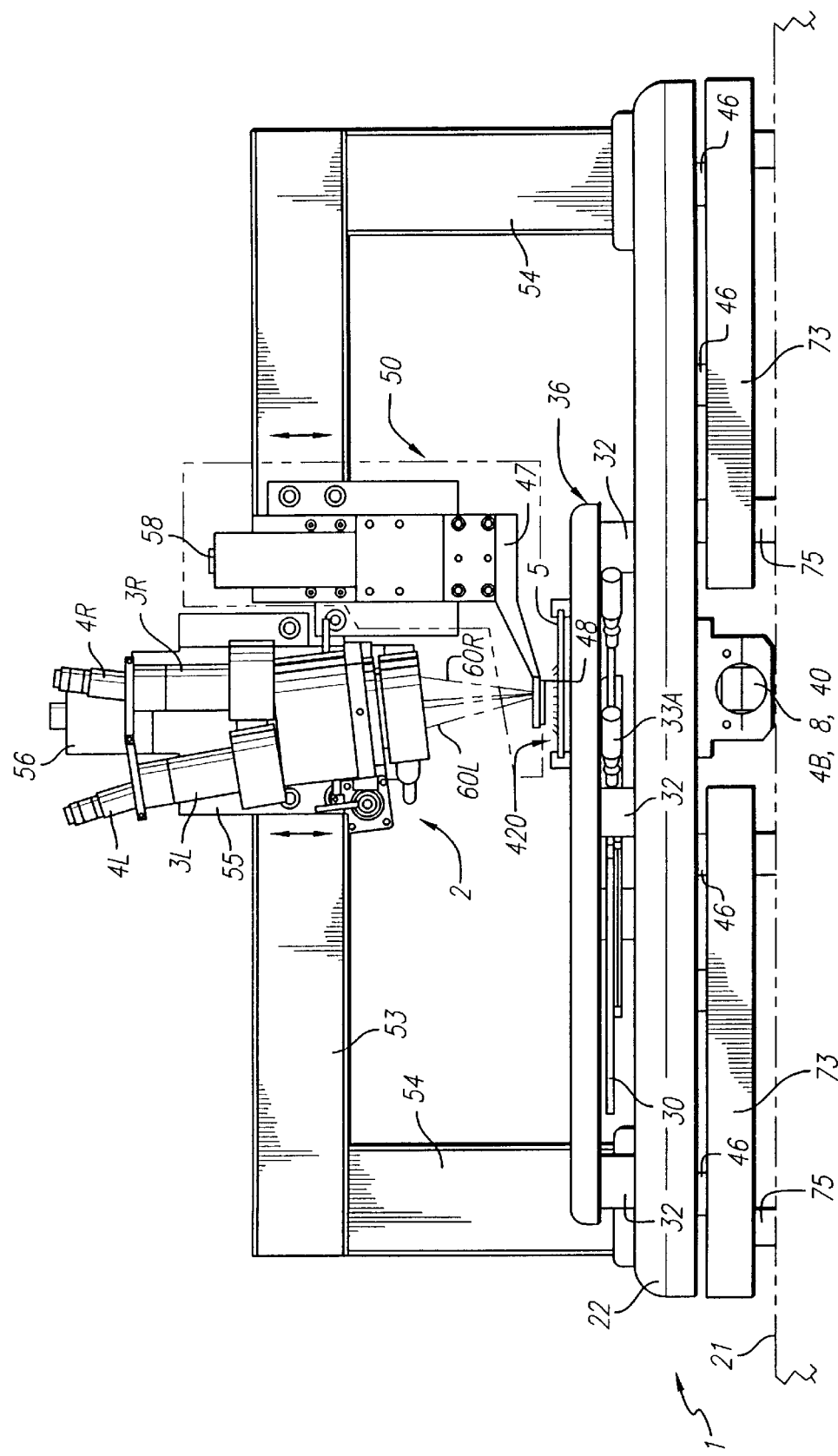
FIG. 2 is a partial section view diagram illustrating a portion of the system shown in FIG. 1.

FIG. 2 shows the support for stereo camera assembly 2 and an overdriver assembly 50, and also shows a probe card stage assembly 36. In FIG. 2, stereo camera assembly 2 is mounted to a rigid support 53,54 that is attached to the upper surface of a granite surface plate 22 having a precisely planar upper surface. A stereo camera mount 55 connects stereo camera assembly 2 to support 53,54, and adjusts the vertical position of stereo camera assembly 2 in response to a motor 56 and associated gearing assembly commercially available as model LM-600-SM, from New England Affiliated Technologies (NEAT).

Overdriver assembly 47 includes transparent glass plate 48 having a precisely planar horizontal bottom surface positioned directly above the tips of probe needles 420. The vertical position of plate 48 is controlled by an overdriver stepper motor 58 and associated gearing assembly commercially available as motor stage assembly NEAT model RM-400-SM.

Figure 3:
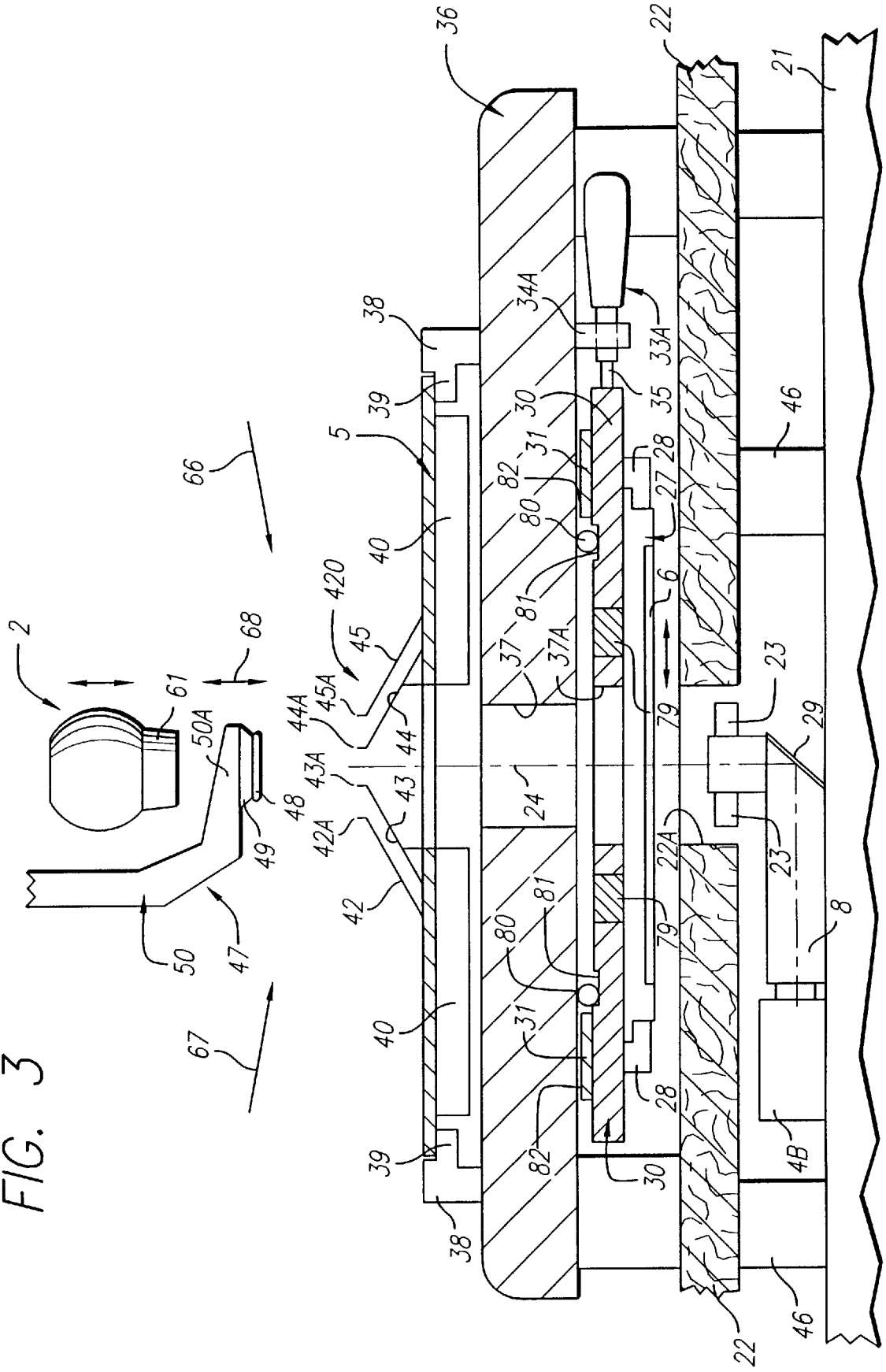
FIG. 3 is a detailed sectional view of the system shown in FIG. 2.

Referring to FIG. 2, probe card assembly 5 is supported on probe card stage assembly 36 (more details of which are shown in FIG. 3). Probe card stage assembly 36 includes feet 32 which constitute friction pads that are slidable on the smooth upper surface of planar granite surface plate 22. A centered hole 22A extends through granite surface plate 22 directly below probe needles 420. Mask camera 4B is located under granite surface plate 22 and directly below probe card stage assembly 36, and views mask 6, which is supported by mask mounting assembly 30. Granite surface plate is supported by compliant equipment mounts 46 which rest on the upper surface of a wood spacer 73, which is supported by rubber feet 75 on a suitable table 21.

Referring to FIG. 3, probe card assembly 41 includes two closely "layered" sets of probe needles 42 and 43 having needle tips 42A and 43B, respectively. Inclined layers of probe needles 44 and 45 have needle tips 44A and 45A, respectively. To provide the overdriven configuration, arm 50A of overdriver assembly 50 is lowered in the direction of arrow 68 by operating motor stage assembly 58 to lower transparent flat glass plate 48 and press it against the needle tips 42A, 43A, etc. to elastically deform them through the above mentioned approximately 3 mil "overdrive distance". Glass plate 48 is somewhat larger than the field of view of microscope assembly 2, but is much smaller than a semiconductor wafer, and therefore allows much better access by an operator's tweezers to the probe needles 420 (FIG. 2).

Probe card assembly 5 includes elements 40, which are electrical contactor simulators. Such electrical contactor simulators perform the function of simulating the mechanical load on the probe card assembly 5 by means of spring loaded electrical contactors of the type often referred to as "pogo pins" in order to provide exactly the same deflection of the probe card assembly 5 as occurs when it is being electrically contacted in the probe card testing machine in which the probe card is used to test integrated circuit wafers.

Probe card assembly 5 is supported by means of a fixture 38,39 that is attached by suitable screws onto the upper surface of the probe card stage assembly 36, which is formed of magnetic stainless steel so that the probe needles 420 are directly above a calibration hole 37 through probe card stage assembly 36. As shown in FIG. 3A, which is a bottom perspective view of probe card stage assembly 36, four foot pads 32 are attached to the four corners of the bottom surface of probe card stage assembly 36. Pads 32 rest on the smooth, precisely planar upper surface of a granite surface plate 22, which has a clearance hole 22A aligned with calibration hole 37 of probe card stage assembly 36. Granite surface plate 22 can be approximately 2 inches thick and 36 inches by 30 inches. Its weight can be about 200 pounds. The diameter of clearance hole 22A can be approximately 3 inches. The diameter of calibration hole 37 can be approximately 2 inches. The dimensions of probe card stage assembly 36 can be approximately 16 inches by 16 inches and the thickness of the stainless steel support/adjustment plate portion 30 thereof can be 0.75 inches.

The mask support/adjustment plate 30 has a clearance hole 37A therein which is aligned with clearance hole 37, and is formed of nonmagnetic material. Plate 30 has four magnets 31 attached to its upper surface and is pulled tightly upward against the planar bottom surface of probe card stage assembly 36. Adjacent to each of magnets 82, which can be any of a wide variety of commercially available "rare earth" magnetic disks, is a shallow recess 81 in the upper surface of plate 30 to "capture" a ball bearing 80 of diameter sufficient to provide a slight gap 82 between the upper surface of each magnetic disk 31, and the lower surface of probe card stage assembly 36.

Four similar rare earth magnetic disks 79 are affixed in holes through plate 30 to attach mask support plate 27 tightly against the bottom surface of plate 30, with brackets 28 functioning as a guide.

Three micrometer assemblies 33A, 33B, and 33C having mounts 34A, 34B, and 34C, respectively, are attached to the bottom surface of probe card stage assembly 36 to provide x,y,θ translation of mask adjustment plate 30 relative to probe card stage assembly 36, to thereby allow alignment of mask 6 precisely with the tips of probe needles 420. The use of the magnets 31 with ball bearings 80 contacting the bottom surface of probe card stage assembly 36 allows precise, steady lateral adjustment of the position of plate 30 without use of complex mechanical mounts to support mask support/adjustment plate 30.

Granite surface plate 22 can be supported by approximately 20 uniformly spaced compliant equipment mounts 46 on a table 21. Support(s) 46 rest on the upper surface of a work table 21 or the like. Sufficient room is left between the upper surface of work table 21 and the bottom surface of granite surface plate 22 to accommodate video camera 4B, zoom/optic unit 8, and right angle mirror unit 7 so its "folded" vertical optical axis 24 passes through the center of a light ring assembly 23 that illuminates the bottom of mask 6. Mask 6 is supported by a mask holder 27 which is attached by a bracket 28 to the bottom surface of mask support/adjustment plate 30 in alignment with clearance holes 37A and 37. Holes 37 and 37A are calibration holes and are used to align the upper and lower optical axes. This is accomplished by affixing the glass mask with a target on the mask holder 27 and then adjusting the axes and zoom magnification so the upper and lower images are exactly overlayed.

Figure 4:
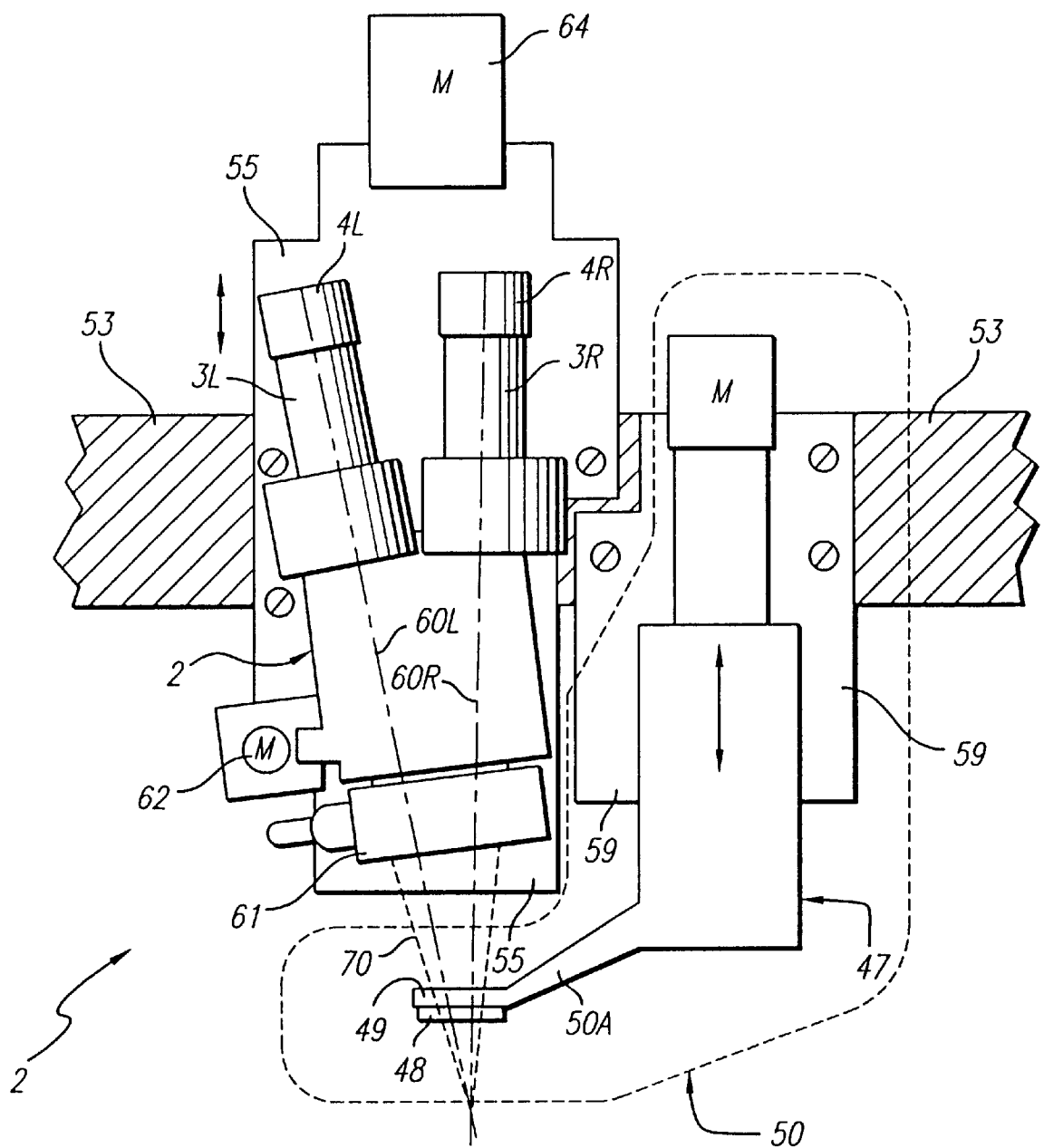
FIG. 4 is a partial elevation view of the stereo microscope and overdriver portion of the system shown in FIGS. 1–3.

FIG. 4 shows more detail of stereo microscope 2 and overdriver assembly 47, both of which are mounted by means of their respective mounting assemblies 55 and 59, respectively. The optical axes 60R and 60L of right and left eyepieces 3R and 3L, respectively, are shown with the angle θ therebetween, of approximately 7 degrees. Mounting assemblies 55 and 59 are bolted onto a horizontal member 53 which is supported at opposite ends by a pair of the uprights 54 of FIG. 2. Numeral 62 in FIG. 4 designates a zoom control motor that determines the magnification of stereo microscope 2. An optical sensor assembly 62 establishes "stops" for the zoom function of stereo microscope 2. Dotted lines 70 designate light rays from the target image on which microscope 2 is focused; this target usually will be a portion of probe needles 420 (FIGS. 1–3). Dotted lines and arrows 69 designate rays from the target image into left eyepiece 3L.

Figure 5:
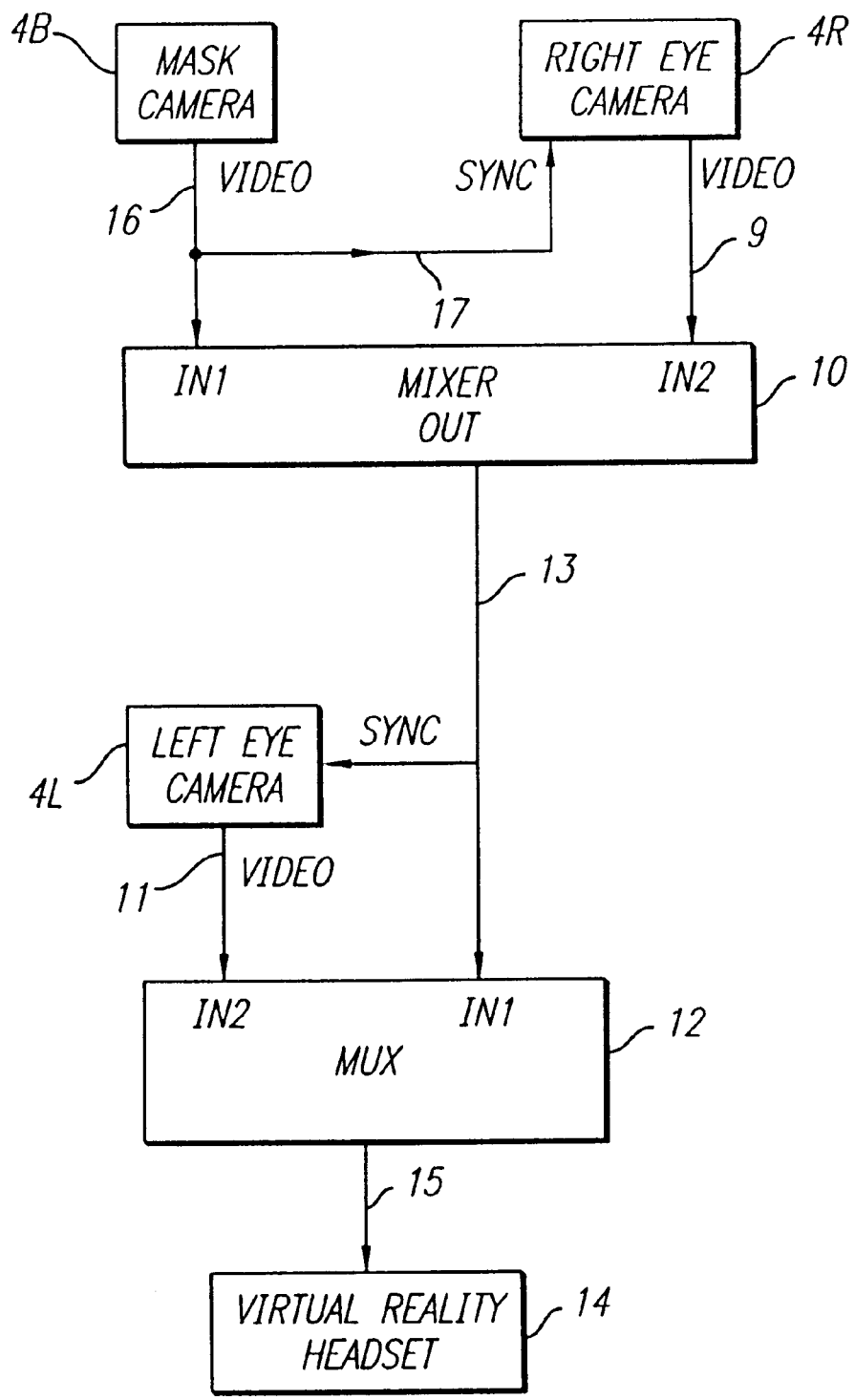
FIG. 5 is a block diagram of the electrical system of the inverted alignment station and system of FIGS. 1–4.

FIG. 5 is a block diagram of an alternate and presently preferred configuration of the mask camera 4B, right and left eye cameras 4R and 4L, mixer 10, multiplexer 12, and virtual reality headset 14. Using the above identified commercially available components, best results are achieved if the video outputs 9 of right eye camera 4R and 16 of mask camera 4B are input into the two inputs of mixer 10 as shown, with the synchronization signal 17 for right eye camera 4R being derived from mask camera video output 16. Then, the mixed output 13 from mixer 10 is utilized both to synchronize left eye camera 4L and to provide a composite video input to the IN1 input of multiplexer 12. The video output 11 of left eye camera 4L is applied to the IN2 input of multiplexer 12. The output 15 of multiplexer 12 then represents a three-dimensional view of in-focus probe needles 420 superimposed on an image of the various dots 18 of mask 6 with which the tips of the probe needles are to be aligned, respectively. Since the optical axis of mask camera 4B is precisely vertically aligned with the optical axis 60R of right eyepiece 3R, the operator wearing virtual reality headset 14 can select the desired magnification of the probe needle images and the dots of mask 6 as they appear in the image produced on the screen inside virtual reality headset. Alignment must, of course, be accomplished at the proper calibrated magnification. The operator also can watch his or her deployment of the tweezers to align any misaligned probe needles with the corresponding dots 18 on mask 6. The flat plate 48 of the overdriver assembly is raised each time the operator uses tweezers to realign a probe needle, and then is lowered through the overdrive distance to confirm that the adjusted probe needle is now properly aligned with its corresponding dot.

Figure 6:
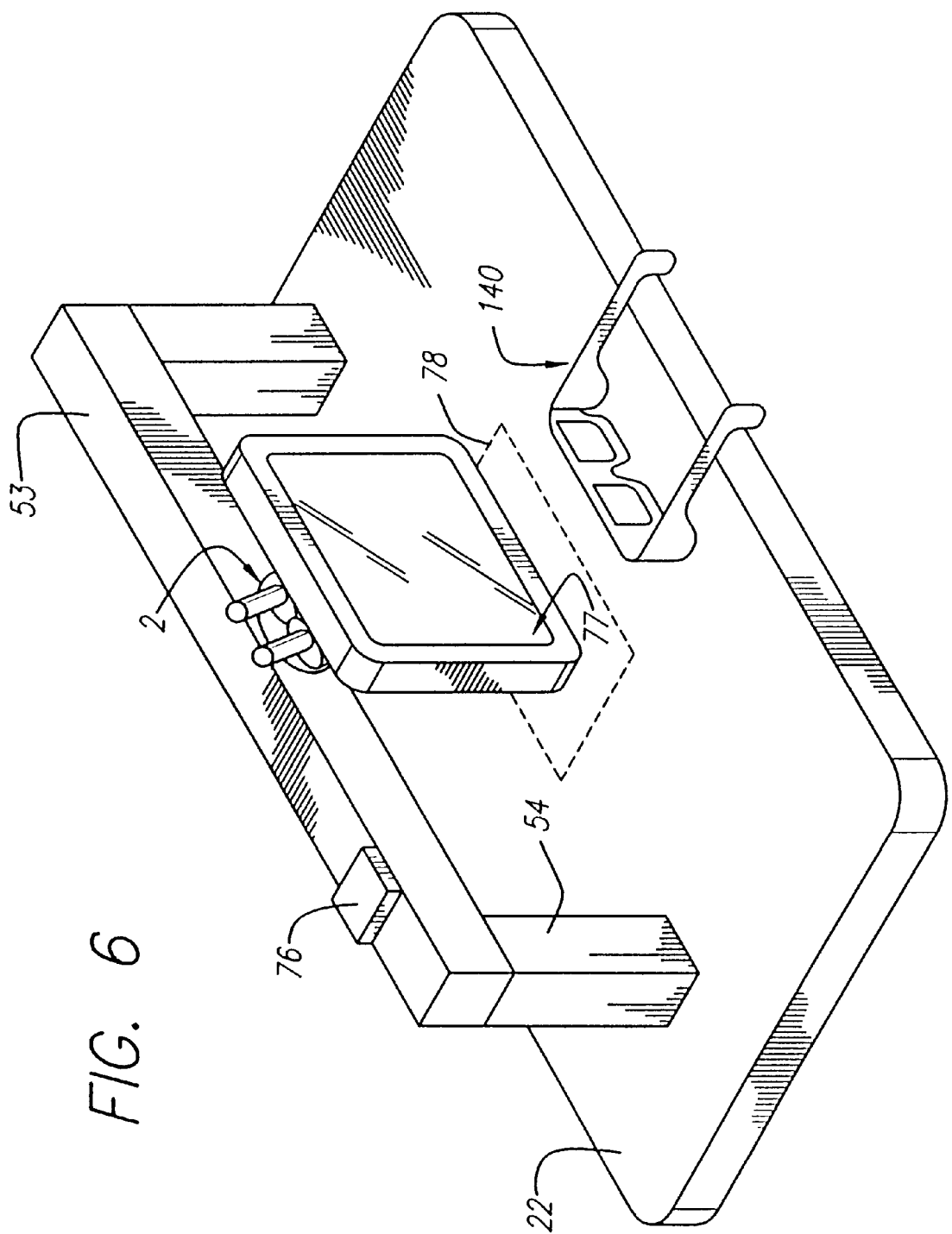
FIG. 6 is a partial perspective view illustrating another embodiment of the invention.

FIG. 6 shows an alternative embodiment of the invention in which a commercially available flat screen monitor or display, with a screen size of about fourteen inches diagonal is suspended on member 53 above the region indicated by dotted line 78 on the surface of granite surface plate 22. Probe card stage assembly 36 is supported in the general region indicted by dotted line 78. Flat screen display 77 is suspended in front of (i.e., on the operator's side of) stereo microscope assembly 2, and is connected to receive the same video signals as headset 14 shown in FIG. 1 and display the same images. In this embodiment of the invention, however, virtual reality headset 14 described above is not used, and instead a pair of conventional readily available "shutter glasses" 140 operable in synchronization with flat plate display 77.

Shutter glasses 140 are controlled by infrared signals from a transmitter device 76 that is coupled in synchronization with the circuitry shown in FIG. 1 or FIG. 5 to allow the operator to alternately view right eye images and left eye images being alternately, stereoscopically displayed on display 77 so as to appear as a three-dimensional view of the probe needles simultaneously displayed with the image of a portion of the mask 6. This allows the user to see larger three-dimensional images of the probes and to also simultaneously see the two-dimensional mask image as described above. Shutter glasses 140 are less expensive and more comfortable than virtual reality headset 14, and the screen resolution of flat screen display 77 is substantially better than that provided by virtual reality headset 14.

The above described invention thus provides an inverted alignment station which is quite simple in structure, yet provides the heretofore unachievable advantage of allowing the operator convenient access all of a large number of the probe needles, even multi-layered and/or multi-DUT probe needle arrangements, with tweezers from locations above, rather than beneath the probe card surface. The operator can select the desired magnification of the video image needle tips and corresponding dots of the mask with which they are to be respectively aligned and of the tips of the tweezers used to adjust the alignment of individual needle probe tips as they are seen on the internal screen of virtual reality headset 14 and/or on an auxiliary TV monitor 14B (FIG. 1) or flat screen display 140 (FIG. 6). Virtual reality headset 14 also allows the user to look through its transparent front image screen to assist in performing associated tasks (such as rough placement/positioning of the probe card/mask/stage assembly into the field of view, and rough placement of the tweezers into the field of view without damaging probe needle tips) and still have the three-dimensional image of the probes and the superimposed image of the mask dots readily visible at all times. Precise initial alignment of the right and left eye cameras and the mask camera is easily achieved by the described structure. Use of the single stage probe card fixture in conjunction with the flat granite support surface plate 22 having a high degree of planarity allows a repeatable probe needle planarity of about one ninth of the flatness of the surface plate. (For example, a 400 micro-inch granite surface plate provides about 50 micro-inches of planarity in a probe card.) The need to overdrive the probe needles against a large mask that interferes with access to the needles is avoided.

Furthermore, the three-dimensional character of the probe needle images seen in the virtual reality headset greatly reduces fatigue of the operator, who no longer needs to strain to see the needles and tweezer tips, and can hold his or her head in a comfortable position (rather than continually peering into the microscope eyepiece) and hence perform the task of aligning the probe needles more accurately and effectively.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

For example, the video image of the masks could be generated in any fashion, even from image data stored in a ROM or EPROM, as long as it is scaled the same as the microscope image of the needles and is displayed simultaneously therewith.

What is claimed is:

1. An apparatus for aligning probe needles of an integrated circuit wafer testing device, comprising in combination:
   (a) a probe card assembly including a plurality of probe needles;
   (b) a first support device supporting the probe card assembly with the probe needles extending upward from a first surface thereof;
   (c) a microscope disposed above the probe card assembly and including a first eyepiece generally aligned with some of the probe needles in its field of view;
   (d) a first video camera positioned in optical alignment with the first eyepiece to view probe needles through the first eyepiece;
   (e) an overdriver including a transparent planar plate movably disposed between the microscope and the probe needles and operative to displace contact tips of at least some of the probe needles through an overdrive distance;
   (f) a device producing a video signal representing a mask image including a plurality of spots located at positions corresponding precisely to positions of contact pads of an integrated circuit to be probe tested;
   (g) circuitry combining a video signal produced by the first video camera and the video signal representing the mask image to simultaneously represent images of the probe needles and the spots on the probe plate; and
   (h) a display simultaneously displaying overlapping images of the probe needles and the spots to aid in alignment of contact tips of probe needles with corresponding spots of the mask plate.

2. The apparatus of claim 1 wherein the microscope is a stereo microscope and includes a second eyepiece tilted relative to the first eyepiece and having the probe needles in its field of view to provide a three-dimensional view of the probe needles, and further including a second video camera disposed in fixed relationship to the second eyepiece and in optical alignment therewith.

3. The apparatus of claim 2 wherein the combining circuit combines the video output of the first and second video cameras to provide the three-dimensional image.

4. The apparatus of claim 3 wherein the plurality of probe needles includes all probe needles needed to probe test one integrated circuit die.

5. The apparatus of claim 3 wherein the plurality of probe needles includes all probe needles needed to simultaneously probe test a plurality of integrated circuit die on a single semiconductor wafer.

6. The apparatus of claim 1 wherein the display includes a virtual reality headset which displays aligned images of both the mask plate and the probe needles.

7. The apparatus of claim 6 wherein the virtual reality headset has a see-through screen that allows the user to simultaneously see the images of the probe needles, the mask plate, and light from physical objects in front of the virtual reality headset.

8. A method of aligning probe needles of an integrated circuit wafer testing device, comprising the steps of:
   (a) supporting a probe card assembly including a plurality of probe needles extending upward from a first surface thereof;
   (b) positioning a first video camera in optical alignment with a first eyepiece of a microscope disposed above the probe card assembly such that some of the probe needles are in its field of view;
   (c) providing a video signal representing a mask image including a plurality of spots located at positions corresponding precisely to positions of contact pads of an integrated circuit to be probe tested;
   (d) combining the video signal produced by the first video camera and the video signal representing the mask image to simultaneously represent images of the probe needles and the spots on the probe plate; and
   (e) simultaneously displaying overlapping images of the probe needles and the spots to aid in alignment of contact tips of probe needles with corresponding spots of the mask plate.

9. The method of claim 8 including the step of moving a transparent, planar plate disposed between the microscope and the probe needles to displace contact tips of at least some of the probe needles through an overdrive distance.

10. An apparatus for aligning probe needles of an integrated circuit wafer testing device, comprising in combination:
    (a) a probe card assembly including a plurality of probe needles;
    (b) a first support device supporting the probe card assembly with the probe needles extending upward from a first surface thereof;
    (c) a microscope disposed above the probe card assembly and including a first eyepiece generally aligned with some of the probe needles in its field of view;
    (d) a first video camera positioned in optical alignment with the first eyepiece to view probe needles through the first eyepiece;
    (e) an overdriver including a transparent planar plate movably disposed between the microscope and the probe needles and operative to displace contact tips of at least some of the probe needles through an overdrive distance;
    (f) a second support device supporting a mask plate below the probe card assembly, the mask plate having thereon a plurality of spots located at positions corresponding precisely to positions of contact pads of an integrated circuit to be probe tested;
    (g) a second video camera disposed below the mask plate and in optical alignment with the first video camera, the second video camera including at least some of the spots within its field of view;
    (h) circuitry combining video signals produced by the first and second video cameras to simultaneously represent images of the probe needles and the spots on the probe plate; and
    (i) a display simultaneously displaying overlapping images of the probe needles and the spots to aid in alignment of contact tips of probe needles with corresponding spots of the mask plate.

11. The apparatus of claim 10 wherein the microscope is a stereo microscope and includes a second eyepiece tilted relative to the first eyepiece and having the probe needles in its field of view to provide a three-dimensional view of the probe needles, and further including a third video camera disposed in fixed relationship to the second eyepiece and in optical alignment therewith.

12. The apparatus of claim 11 wherein the combining circuit combines the video output of the first and third video cameras to provide the three-dimensional image.

13. The apparatus of claim 12 wherein the optical axis of the first video camera and the first eyepiece are perpendicular to the plane of the mask plate.

14. The apparatus of claim 12 wherein the plurality of probe needles includes all probe needles needed to probe test one integrated circuit die.

15. The apparatus of claim 12 wherein the plurality of probe needles includes all probe needles needed to simultaneously probe test a plurality of integrated circuit die on a single semiconductor wafer.

16. The apparatus of claim 10 wherein the display includes a virtual reality headset which displays aligned images of both the mask plate and the probe needles.

17. The apparatus of claim 16 wherein the virtual reality headset has a see-through screen that allows the user to simultaneously see the images of the probe needles, the mask plate, and light from physical objects in front of the virtual reality headset.

18. A method of aligning probe needles of an integrated circuit wafer testing device, comprising the steps of:
    (a) supporting a probe card assembly including a plurality of probe needles extending upward from a first surface thereof;
    (b) positioning a first video camera in optical alignment with a first eyepiece of a microscope disposed above the probe card assembly such that some of the probe needles are in its field of view;
    (c) supporting a mask plate below the probe card assembly, the mask plate having thereon a plurality of spots located at positions corresponding precisely to positions of contact pads of an integrated circuit to be probe tested;
    (d) positioning a second video camera below the mask plate and in optical alignment with the first video camera so that at least some of the spots are in the field of view of the second video camera;
    (e) combining video signals produced by the first and second video cameras to simultaneously represent images of the probe needles and the spots on the probe plate; and
    (f) simultaneously displaying overlapping images of the probe needles and the spots to aid in alignment of contact tips of probe needles with corresponding spots of the mask plate.

19. The method of claim 18 including the step of moving a transparent, planar plate disposed between the microscope and the probe needles to displace contact tips of at least some of the probe needles through an overdrive distance.

* * * * *